United States Patent [19]

Raychaudhuri

[11] Patent Number: 5,312,664
[45] Date of Patent: May 17, 1994

[54] OPTICAL RECORDING MEDIA

[75] Inventor: Pranab K. Raychaudhuri, Rochester, N.Y.

[73] Assignee: Eastman Kodak Company, Rochester, N.Y.

[21] Appl. No.: 886,218

[22] Filed: May 21, 1992

[51] Int. Cl.$^5$ .............................................. B32B 3/00
[52] U.S. Cl. ....................................... 428/64; 428/65; 428/457; 428/913; 430/270; 430/495; 430/945; 346/76 L; 346/135.1
[58] Field of Search ................... 428/64, 65, 457, 913; 346/76 L, 135.1; 430/270, 495, 945

[56] References Cited

U.S. PATENT DOCUMENTS

| | | | |
|---|---|---|---|
| 4,663,008 | 5/1987 | Takeda | 204/192 |
| 4,756,811 | 7/1988 | Takeda | 204/192 |
| 4,774,170 | 9/1988 | Pan | 430/495 |
| 4,795,695 | 1/1989 | Pan | 430/495 |
| 4,798,785 | 1/1989 | Pan | 430/495 |
| 4,929,485 | 5/1990 | Ohkawa et al. | 428/64 |
| 4,981,772 | 1/1991 | Pan et al. | 430/346 |
| 4,985,349 | 1/1991 | Ohkawa et al. | 430/945 |
| 4,994,354 | 2/1991 | Toibana et al. | 430/945 |
| 5,102,708 | 4/1992 | Matsubara et al. | 428/64 |

Primary Examiner—Patrick J. Ryan
Assistant Examiner—Elizabeth Evans
Attorney, Agent, or Firm—John R. Everett

[57] ABSTRACT

Optical recording films made from alloys of antimony-tin and a third element exhibit improved properties when formed in a sputtering atmosphere containing a mixture of inert and organic gases. The amount of organic gas in the sputtering atmosphere is controlled. Improvements include higher amorphous to crystalline transition temperature and greater stability of the recorded and unrecorded film.

6 Claims, No Drawings

OPTICAL RECORDING MEDIA

FIELD OF THE INVENTION

The present invention relates to antimony-tin-indium and other alloys that are useful in optical recording and methods of improving their stability.

BACKGROUND OF THE INVENTION

Information recording in write-once type media is achieved by laser induced thermal crystallization of the as-prepared amorphous film. Recording films of this type are known as phase-change media. The amorphous-to-crystalline transition temperature (hereafter "transition temperature"), that is, the temperature at which an amorphous film spontaneously and rapidly converts to the crystalline state, is a function of the film's chemical composition. A low transition temperature is an indication of high recording sensitivity and low thermal stability of the media. In designing an optical recording thin film, an optimization is made that maximizes the performance, that is, maximizes the stability to sensitivity ratio within an acceptable range.

The amorphous material is in a metastable state and may slowly convert to the stable crystallized state in extended aging at a temperature lower than its transition temperature. A disk may become unusable by random nucleation and subsequent growth of the nuclei in the unwritten area as well as by growth of the laser written spots (which already have nuclei for growth). It is likely that growth of the laser crystallized spots will occur before random nucleation and growth. Data retention may be of greater concern than the shelf life of the unwritten disk.

Optical recording media made of binary antimony-tin alloy have relatively low transition temperatures. This may be adequate for some applications, but improvement is desirable for applications where ambient temperatures exceed room temperature.

Indium can be used to enhance the stability of the amorphous phase of the SbSn alloy by increasing the transition temperature. Indium was first selected since its atomic number (49) is similar to that of antimony (51) and tin (50).

Subsequent to the discovery that indium could be used to improve the properties of the antimony-tin alloy, other antimony-tin based alloys were discovered by the present assignee. Thus, applications were filed on antimony-tin alloys containing aluminum (U.S. Pat. No. 4,798,785); zinc (U.S. Pat. No. 4,774,170); and germanium (U.S. Pat. No. 4,795,695).

The Kodak proprietary high-performance optical recording thin films of Sb-Sn-In alloys are believed (based on the extrapolation of high temperature data) to indefinitely remain in the as-prepared amorphous state at room temperature. In thermally incubated samples, however, the laser crystallized spots show extensive growth.

It would be desirable to preserve the advantageous features of SbSnIn and other SbSn alloys and increase their stability under conditions where ambient temperatures exceed room temperature.

SUMMARY OF THE INVENTION

In accordance with the present invention, it has now been discovered that when an organic gas is present in the sputtering gas, the resulting thin recording films formed from alloys of SbSn and indium (or another third metallic element) exhibit a remarkable degree of stability. By organic gas is meant a carbon-containing gas such as methane, acetylene etc. Stability is judged by the rate of growth of crystalline marks as a function of temperature and time. The presence of an organic gas in the sputtering atmosphere results in an increase in the transition temperature and thereby to an improvement in the stability of the amorphous state of the films. The concentration range of the organic gas can be selected such that the stability is high and the loss in sensitivity insignificant.

Thus, in accordance with the present invention, there is provided a method of forming a write-once optical recording film, comprising the steps of:

a) disposing a substrate in a sputtering atmosphere containing a mixture of an inert gas and an organic gas;

b) disposing in said atmosphere a metal alloy target represented by the formula:

$$Sb_a Sn_b X_c$$

where X is an element selected from the group consisting of indium, germanium, aluminum, cadmium, and zinc; and a, b, and c represent atomic percents of the elements in the SbSnX alloy wherein $55 < a < 75$; $5 < b < 40$; and $5 < c < 30$;

c) maintaining in the sputtering atmosphere a concentration of organic gas sufficient to increase the transition temperature of a recording film sputtered from the alloy target of (b); and d) sputtering the metal alloy target of (b) in the organic gas-containing atmosphere of (c) thereby depositing the optical recording film.

In another aspect of the invention there is provided an optical recording film represented by the formula:

$$(Sb_a Sn_b X_c)_{100-m-n} C_m H_n$$

wherein X is an element selected from the group consisting of indium, germanium, aluminum, cadmium, and zinc; a, b, and c represent atomic percents of the elements in the SbSnX alloy wherein $55 < a < 75$; $5 < b < 40$; $5 < c < 30$; m and n represent atomic percents of carbon and hydrogen in the recording film that are effective to increase the transition temperature over recording films of identical SbSnX composition, but not containing carbon or hydrogen.

It was surprising that by introducing a small amount of an organic gas in the sputtering atmosphere during the preparation of SbSn based alloys, we were able to increase considerably the stability and performance of the films.

DETAILED DESCRIPTION OF THE INVENTION

Crystallization usually proceeds by nucleation and growth. In many cases nucleation is the rate limiting step. An amorphous film may be stable by itself, but the presence of crystalline nuclei, such as those that exist at laser recorded marks, will result in a rapid crystallization of the film. Thus, growth of the laser recorded crystalline spot will occur before random nucleation that precedes crystallization of the amorphous film. Hence, the growth rate of crystallized marks is a more suitable criterion (compared to transition temperature) in judging the stability of the recording film.

Films prepared according to the method of the invention and tested for the rate of growth of crystallization marks, demonstrate greater stability over films of identical composition but prepared in a sputtering atmosphere with no organic gas.

Besides indium, other elements which may be added to the antimony-tin alloy include aluminum, zinc, germanium, cadmium, gallium, titanium, silicon, manganese, tellurium, niobium, iron, copper, tungsten, lead, molybdenum, sulfur, nickel, selenium, thallium, arsenic, phosphorous, gold, palladium, platinum, hafnium, vanadium, and their alloys and mixtures.

The gas in the sputtering chamber should be controlled so as to maintain an atmosphere containing a volume fraction of organic gas sufficient to retard significantly the growth of crystalline marks on the as-prepared amorphous film. It is generally found that that is the amount of organic gas required to increase the transition temperature by at least 15° C. The specific volume fraction will depend on the composition of the particular SbSnX alloy and the particular organic gas used.

For example, in Table I, film #4 requires 1.6 volume percent of methane to raise the transition temperature to 194° C.; while film #8 in Table II requires only 0.41 volume percent of acetylene to raise the transition temperature to 195° C.

In general, the volume fraction of organic gas required in the sputtering atmosphere is greater than zero and less than 10 volume percent, preferably between 0.03 and 7.0 volume percent, and most preferably between 0.03 and 5.3 volume percent.

The amount of organic gas in the sputtering gas is controlled either by premixing an inert and an organic gas or by separately controlling the flow rate of a mixture of inert gas and organic gas into the sputtering atmosphere.

Several representative films were prepared from an $Sb_{70}Sn_{15}In_{15}$ target in an atmosphere containing either argon only (control films), argon mixed with methane, or argon mixed with acetylene. These films were analyzed using the Rutherford Back Scattering technique to determine the concentration of carbon in the films. To determine hydrogen concentration, Forward Recoil Spectrometry (Elastic Recoil Detection) method was used. Both methods are described by Feldman, L. C. and Mayer, J. W., *Fundamentals of Surface and Thin Film Analysis*, chapter 2, page 13, North Holland (1986). Results are shown in Table III and discussed infra. These examples show that the improved films of the invention are represented by the formula:

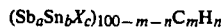

$(Sb_aSn_bX_c)_{100-m-n}C_mH_n$ wherein X is an element selected from the group consisting of indium, germanium, aluminum, cadmium, and zinc; a, b, and c are atomic percents of the elements in the SbSnX alloy wherein $55<a<75$, $5<b<40$, $5<c<30$; and m and n are amounts of carbon and hydrogen that are effective to increase the transition temperature over recording films of identical SbSnX composition, but not containing carbon or hydrogen. In general, $0<m<15$, and $0\leq n<5$, preferably $0<m<10$, and $0\leq n<5$, and most preferably, $3<m<7$ and $0\leq n<3$.

Optical recording films can be prepared by conventional thin film deposition techniques such as RF (radio frequency) and DC (direct current) sputtering from an alloy target using the alloys of the invention. Enhancement of sputtering processes by applying magnetic fields (magnetron sputtering) can also be used. The thickness of the films can be from a few tens to a few hundreds of nanometers depending on compromises among factors such as contrast, sensitivity, production rate, material cost, ease of control, data rate, etc. Preferably, the film is about 80 nm thick.

Supports which can be used include plastic plates such as polyethylene terephthalate, polymethyl methacrylate, and polycarbonate, a glass plate, paper and metallic plates such as aluminum. Flexible supports such as plastic webs can also be used. The recording element can be in the form of a disc, a card, or a tape.

Recording of information on the thin film layers made using the alloy of this invention is achieved by focusing an information modulated laser beam on the layer thereby forming a pattern of information on the layer in the form of crystallized areas in an otherwise amorphous layer.

A useful recording material comprises, starting from the outside surface of the recording material, an optional overcoat layer, a thin film optical recording layer and a substrate. In response to a drive signal, the intensity of a diode recording beam focused on the recording layer is modulated in accordance with information to be recorded.

In the case of an optical disc, during recording the recording material is spun at a constant rate, for example, 1800 rotations per minute (RPM). As a result, a track of information is recorded on the optical recording layer in the form of selected crystallized areas. As recording continues, the recording spot is caused to scan radially across the recording material, thereby causing information to be recorded along a spiral or concentric track. The sizes and spacings of the recorded information marks vary in accordance with the information content of the recording laser drive signal, as well as with radial position on the recording material.

During the readback process, the thus recorded information bearing recording material is spun at the same rate as it was spun during the recording process. The readout laser beam is focused to a playback spot on the recording material by a high numerical aperture lens. The recording material is of the reflective type so that the laser radiation is reflected back through the high numerical aperture lens after interacting with the information marks recorded on the optical recording material. A lens directs reflected laser radiation onto a detector which produces an electrical playback signal in response to temporal variations (contrast) in the irradiance of the reflected laser radiation falling on the detector.

Other types of recording films are also useful. For example, a reflective substrate such as aluminum can be provided with a recording layer comprising an alloy of the invention on both sides of the substrate. A useful recording film is thus, aluminum coated on both sides with a smoothing layer, a layer of the phase change alloy of the invention and a layer of a clear protective overcoat. In yet another embodiment, the alloy as described is provided on a transparent substrate to form the recording film. This optical recording film is then adhered to another recording film of identical composition with an adhesive layer. The thickness of the adhesive layer provides for the optical separation of the two recording layers.

In the examples presented below, the samples were tested for transition temperature by the following procedure. Amorphous films to be tested were placed on a hot plate in a flowing nitrogen atmosphere. The temperature was raised at a rate of 0.6° C. per minute. During this heating, the specular reflectance of the surface of the film was monitored until the entire film crystallized and the reflectance achieved its maximum. The data was analyzed and the amorphous to crystalline transition temperature was taken as the temperature at which the sample achieved one half of its total reflectance change. Results are shown in Tables I and II.

The following examples are presented to further illustrate the practice of the invention.

EXAMPLE 1

Preparation and Analysis of Optical Recording Film

A 2 inch diameter sputtering target with the composition, 70 at % of Sb and 15 at % each of In and Sn, was prepared by melting the high purity constituents and casting the alloy in a graphite mold. The entire operation and cooling of the target was performed in flowing atmosphere of pure argon. Although SbSnIn films are used in these examples, similar results are expected with other SbSnX films, where X is Ge, Cd, Al, or Zn, alone or in combination.

A series of films were deposited by sputtering from the above-described SbSnIn alloy target with a composition of 70% Sb, 15% In, and 15% Sn. The target-to-substrate distance was about 2.25 inches. The sputtering was carried out using a 2" Ion Tech magnetron direct current (DC) sputtering gun using a power of 50 W (410 V and 0.118 A), a pressure of 3 mTorr, a gas flow rate of 12 SCCM (cc/minute), a deposition rate of 6 Å/s on a rotating substrate (estimated deposition rate ≈50 Å/s on a stationary substrate), and deposition time of 2.5 minutes in a sputtering gas of either electronic grade Ar or Ar mixed with a small amount of an organic gas such as methane or acetylene.

The volume percentage of organic gas in the sputtering gas was controlled by controlling the relative flow rate of Ar and an Ar-and-organic-gas mixture such that a percentage greater than zero and equal to or greater than 10 percent would be maintained.

The concentration of carbon and hydrogen in the recording films was determined by Rutherford Back Scattering technique (carbon) and Forward Recoil Spectrometry (hydrogen), as explained above.

Films were prepared onto cleaned microscope slide glass substrates. Subsequently, the prepared films were studied to determine transition temperature and stability of crystallized marks as described above.

EXAMPLE 2

The Effect of Methane on Crystallization Temperature

Films were prepared from an $Sb_{70}Sn_{15}In_{15}$ target as described above. The sputtering gas in the chamber during deposition of the various films was controlled to contain either 0, 0.04, 0.8, 1.6, 3.3, or 6.5 volume percent of methane. Several films were then analyzed by Rutherford Back Scattering technique and Forward Recoil Spectrometry to ascertain the carbon and hydrogen concentration in the films formed in the different argon with methane atmospheres. Crystallization temperatures were determined as described above. The results are shown in Table I.

TABLE I

| Film | % $CH_4$ Conc.[1] | Trans. Temp.[2] [C.] | Growth 150[3] (micron/hr) |
|---|---|---|---|
| 1 | 0 | 163 | 0.160 |
| 2 | 0.4 | 171 | 0.096 |
| 3 | 0.8 | 187 | 0.011 |
| 4 | 1.6 | 194 | * |
| 5 | 3.3 | 204 | * |
| 6 | 6.5 | 219 | * |

[1]Volume % of $CH_4$ in the sputtering gas.
[2]Transition temperature for amorphous to crystalline transformation at the heating rate of 0.6 C./min.
[3]Average rate of propagation of the crystalline/amorphous front.
*Not detectable during the entire testing period of 419 hrs.

EXAMPLE 3

The Effect of Acetylene on Crystallization Temperature

Films were prepared as in Example 2 except that instead of methane, acetylene was added to argon in percent volumes of 0.0, 0.41, 1.21, and 2.39. The results are shown in Table II.

It is obvious from these results that films formed in an atmosphere containing organic gases demonstrate an increase in transition temperature and that the increase is greater as the volume fraction of the organic gas in the sputtering atmosphere increases. There is therefore a direct correlation between organic gas content in the sputtering gas and increase in transition temperature.

An increase in transition temperature is expected to result in a small decrease in recording sensitivity. Since the SbSnIn film has excellent sensitivity to begin with, a small decrease in sensitivity may not present a problem. On the other hand, an increase in transition temperature significantly improves the stability of the amorphous phase.

TABLE II

| Film | % $C_2H_2$ Conc.[1] | Trans. Temp.[2] [C.] | Growth 150[3] (micron/hr) |
|---|---|---|---|
| 7 | 0 | 166 | 0.215 |
| 8 | 0.41 | 195 | 0.002 |
| 9 | 1.21 | 206 | 0.002 |
| 10 | 2.39 | 220 | 0.000 |

[1]Volume % of $C_2H_2$ in the sputtering gas.
[2]Transition temperature for amorphous to crystalline transformation at the heating rate of 0.6 C./min.
[3]Average rate of propagation of the crystalline/amorphous front.
*Not detectable during the entire testing period of 419 hrs.

EXAMPLE 4

Effect of Organic Gas on the Stability of Crystalline Marks

Isothermal incubation studies were performed at 150° C. to evaluate the stability of crystallized marks on the films. Two sets of films were prepared using methane ($CH_4$) and acetylene ($C_2H_2$) as the representative organic gases. With each set a control film was prepared, that is, a film prepared in the absence of an organic gas but otherwise identical to the aforementioned two sets of films. Varying concentrations of methane or acetylene were admitted into the sputtering atmosphere during the preparation of the various test films of the invention.

The films were then exposed to 830 nm laser pulse to make crystallized marks on the as-prepared amorphous film. The dimensions of the crystallized marks were determined by microscopic examination at 1000×.

Each set of films was then tested isothermally at several temperatures for example 150° C. Periodic microscopic examinations at 1000× of the laser crystallized marks permit determination of the propagation rates of the crystalline/amorphous phase boundaries. The data for the 150° C. test are summarized in Tables I and II.

It is evident from these tables that the growth rate of the original laser recorded marks progressively decreases with increasing levels of organic gas. Films prepared in atmospheres with higher concentrations of organic gas, that is, films designated as 4, 5, 6 and 10, showed no detectable mark growth after extended aging for at least 419 hours at any of the temperatures tested. Samples containing lower levels of carbon and hydrogen showed recognizable and measurable growth after only a few days aging, and growth was more pronounced when there was no organic gas in the sputtering atmosphere.

These results indicate that incorporation of an organic gas in the sputtering atmosphere improves the stability of laser recorded (crystallized) marks and this indicates high overall stability of the recorded or unrecorded film, as explained above. These examples were carried out at high temperatures to accelerate the mark growth, but it is known that the growth of crystalline marks will take place over a longer period of time at lower temperatures. Improvement in high temperature mark stability is expected to enhance lower temperature mark stability.

EXAMPLE 5

Effect of Organic Gas on the Composition of the Films $Sb_{70}Sn_{15}In_{15}$ films were prepared and analyzed as described in Example 1 under identical sputtering parameters except for the type of sputtering gas and the concentration of the organic gas. The varying carbon and hydrogen content of the prepared films is shown in Table III. The concentration of oxygen and nitrogen for all films was at or below background levels. The term "background levels" describes insignificant amounts of elements which are sometimes detected in sputtered films, even though all attempts were made to exclude contamination during film preparation. The source of such background levels is undefined.

TABLE III

| Film | Organic Gas | Vol. % in Sp. Gas | Carbon in Film (Atomic %) | Hydrogen in Film (Atomic %) |
|---|---|---|---|---|
| 11 | O | 0 | 0 | Background |
| 12 | $CH_4$ | 0.7 | 4.4 | Background |
| 13 | $CH_4$ | 2.0 | 4.8 | 1.2 |
| 14 | $CH_4$ | 6.7 | 11.7 | 4.5 |
| 15 | $C_2H_2$ | 1.1 | 6.0 | 0.7 |

TABLE III-continued

| Film | Organic Gas | Vol. % in Sp. Gas | Carbon in Film (Atomic %) | Hydrogen in Film (Atomic %) |
|---|---|---|---|---|
| 16 | $C_2H_2$ | 3.3 | 13.2 | 3.3 |

These results indicate that increasing concentrations of the organic gas in the sputtering atmosphere (that is, the method of the invention) yield film compositions with corresponding increases in carbon and hydrogen content. Films with such carbon and hydrogen content are expected to have improved stability.

Our results also indicate that carbon is a key feature in the composition of the films of the invention. For example, film #12, prepared in a sputtering gas containing 0.7 volume percent methane, has a transition temperature of about 187° C. and a mark growth rate of about 0.011 micron/hour., based on the data in Table I. According to our analysis results, this film contains 4.4 atomic percent carbon, while the hydrogen content is not above background levels. Thus, improvement was realized without hydrogen being detected in the film at above background levels. Hence we believe that other organic (that is, carbon-containing) gases not containing hydrogen, such as fluorocarbons, CS2, etc. would also be useful.

The invention has been described in detail with particular reference to preferred embodiments thereof, but it will be understood that variations and modifications can be effected within the spirit and scope of the invention.

We claim:

1. An optical recording film represented by the formula:

$$(Sb_a Sn_b X_c)_{100-m-n} C_m H_n$$

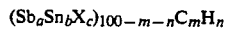

wherein X is an element selected from the group consisting of indium, germanium, aluminum, cadmium, and zinc; a, b, c, m and n represent atomic percents of the elements in the SbSnX alloy wherein $55 < a < 75$; $5 < b < 40$; $5 < c < 30$; $0 < m < 15$ and $0 \leq n < 5$; and m and n represent the atomic percent of carbon in the recording film that are effective to increase the transition temperature over recording films of identical SbSnX composition, but not containing carbon or hydrogen.

2. An optical recording film as defined in claim 1 wherein $0 < m < 15$; and $0 \leq n < 5$.

3. An optical recording film as defined in claim 1 wherein $0 < m < 10$ and $0 \leq n < 5$.

4. An optical recording film as defined in claim 1 wherein $3 < m < 7$, and $0 \leq n < 3$.

5. An optical recording film as defined in claim 1, 2, 3 or 4 wherein X is indium.

6. An optical recording film as defined in claim 1 wherein the carbon and hydrogen present in the film is derived from methane or acetylene.

* * * * *